(12) United States Patent
Mun et al.

(10) Patent No.: US 10,310,342 B2
(45) Date of Patent: Jun. 4, 2019

(54) DISPLAY DEVICE AND MANUFACTURING METHOD THEREOF

(71) Applicant: Samsung Display Co., Ltd, Yongin-si, Gyeonggi-do (KR)

(72) Inventors: Sungjin Mun, Seongnam-si (KR); Namwook Lee, Seongnam-si (KR); Kihun Jeong, Asan-si (KR); Xinxing Li, Suwon-si (KR); Hyeongjun Jin, Seoul (KR)

(73) Assignee: Samsung Display Co., Ltd. (KR)

( * ) Notice: Subject to any disclaimer, the term of this patent is extended or adjusted under 35 U.S.C. 154(b) by 126 days.

(21) Appl. No.: 15/471,892

(22) Filed: Mar. 28, 2017

(65) Prior Publication Data
US 2017/0285390 A1   Oct. 5, 2017

(30) Foreign Application Priority Data

Mar. 29, 2016 (KR) ........................ 10-2016-0037307

(51) Int. Cl.
*G02F 1/1345* (2006.01)
*G02F 1/1333* (2006.01)
*G02F 1/1335* (2006.01)
*G02F 1/1339* (2006.01)
*G02F 1/1362* (2006.01)
*G02F 1/1368* (2006.01)
*H01L 27/12* (2006.01)

(52) U.S. Cl.
CPC ........ *G02F 1/13452* (2013.01); *G02F 1/1339* (2013.01); *G02F 1/13394* (2013.01); *G02F 1/13458* (2013.01); *G02F 1/133345* (2013.01); *G02F 1/133512* (2013.01); *G02F 1/136227* (2013.01); *G02F 1/1368* (2013.01); *G02F 2001/136222* (2013.01); *G02F 2001/136236* (2013.01); *H01L 27/124* (2013.01); *H01L 27/1248* (2013.01)

(58) Field of Classification Search
CPC ........... G02F 1/13452; G02F 1/133345; G02F 1/13458; G02F 2001/136222
See application file for complete search history.

(56) References Cited

U.S. PATENT DOCUMENTS 7,179,673 B2  2/2007  Song et al.
7,794,612 B2  9/2010  Chin et al.
(Continued)

FOREIGN PATENT DOCUMENTS

KR   10-2004-0061292 A   7/2004
KR   10-2011-0044598 A   4/2011
KR   10-2015-0056110 A   5/2015

*Primary Examiner* — Thanh Nhan P Nguyen
(74) *Attorney, Agent, or Firm* — Innovation Counsel LLP

(57) ABSTRACT

A display device includes: a first substrate including a display area and a non-display area; a gate line in the display area and a gate pad in the non-display area, the gate line extending in a first direction; a data line in the display area, the data line extending in a second direction intersecting the first direction; a thin film transistor at an intersection point among the gate line and the data line; a step-difference pattern on the gate pad; and a protective layer including a first protective layer on the thin film transistor and a second protective layer on the step-difference pattern and the gate pad. The second protective layer has a height less than a height of the first protective layer.

19 Claims, 5 Drawing Sheets

(56) References Cited

U.S. PATENT DOCUMENTS

| | | |
|---|---|---|
| 8,610,858 B2 | 12/2013 | Lee et al. |
| 2005/0140892 A1* | 6/2005 | Kim .................. G02F 1/133707 349/139 |
| 2006/0061711 A1* | 3/2006 | Lee ................... G02F 1/133514 349/106 |
| 2011/0090445 A1* | 4/2011 | Kim ..................... G02F 1/1339 349/139 |
| 2011/0254005 A1* | 10/2011 | Kim .................. G02F 1/136227 257/59 |
| 2015/0131018 A1 | 5/2015 | Jeon et al. |

\* cited by examiner

DISPLAY DEVICE AND MANUFACTURING METHOD THEREOF

CROSS-REFERENCE TO RELATED APPLICATION

This application claims priority to Korean Patent Application No. 10-2016-0037307, filed on Mar. 29, 2016, and all the benefits accruing therefrom under 35 U.S.C. § 119, the content of which in their entirety is herein incorporated by reference.

BACKGROUND

1. Field

Exemplary embodiments relate to a display device, and more particularly, to a display device including a short portion in a non-display area and to a method of manufacturing the display device.

2. Description of the Related Art

Display devices are classified into a liquid crystal display ("LCD") device, an organic light emitting diode ("OLED") display device, a plasma display panel ("PDP") device, an electrophoretic display ("EPD") device, and the like, based on a light emitting scheme thereof.

Among the types of display devices, an LCD device includes two substrates opposing each other, an electrode on at least one of the two substrates, and a liquid crystal layer between the two substrates.

Such an LCD device generally has a structure in which a plurality of thin film transistors ("TFTs") and a pixel electrode are disposed on one of the two substrates and a plurality of color filters, a light shielding portion, and a common electrode are disposed on the other of the two substrates. In recent times, however, a color filter on array (COA) structure in which the color filter, the light shielding portion, and the pixel electrode, except the common electrode, are formed on one substrate is being adopted.

In addition, in order to simplify the process, a black column spacer structure in which a column spacer for maintaining a cell gap, which is a gap between the two substrates, is formed simultaneously with a light shielding layer.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments are directed to a display device capable of reducing contact failure between a first substrate and a second substrate and to a method of manufacturing the display device.

According to an exemplary embodiment, a display device includes: a first substrate including a display area and a non-display area; a gate line in the display area and a gate pad in the non-display area, the gate line extending in a first direction; a data line in the display area, the data line extending in a second direction intersecting the first direction; a thin film transistor at an intersection point among the gate line and the data line; a step-difference pattern on the gate pad; and a protective layer including a first protective layer on the thin film transistor and a second protective layer on the step-difference pattern and the gate pad. The second protective layer has a height less than a height of the first protective layer.

The step-difference pattern may have a thickness greater than a thickness of the second protective layer.

The second protective layer may have a protective-layer contact hole extending to the gate pad, and the display device may further include a transparent electrode on the second protective layer, the transparent electrode connected to the gate pad through the protective-layer contact hole.

The display device may further include: a second substrate opposing the first substrate; and a common electrode on the second substrate.

The display device may further include: a conductive ball disposed between the common electrode and the transparent electrode to connect the common electrode and the transparent electrode.

The display device may further include: a light shielding portion on the protective layer and the transparent electrode; and a column spacer protruding from the light shielding portion.

The light shielding portion may have a light-shielding-portion hole in the non-display area, and the light-shielding-portion hole may have a diameter larger than a diameter of the conductive ball.

The step-difference pattern may include a color filter.

According to an exemplary embodiment, a method of manufacturing a display device includes: preparing a first substrate including a display area and a non-display area; forming a gate line in the display area and forming a gate pad in the non-display area; forming a data line in the display area, the data line intersecting the gate line; forming a thin film transistor connected to the gate line and the data line; forming a step-difference pattern on the gate pad; and forming a protective layer including forming a first protective layer on the thin film transistor and forming a second protective layer on the step-difference pattern and the gate pad, the second protective layer having a protective-layer contact hole extending to the gate pad. The second protective layer has a height less than a height of the first protective layer.

The forming of the first protective layer and the forming of the second protective layer may be performed in substantially a same process.

The forming of the first protective layer and the forming of the second protective layer may include: coating a photosensitive composition in the display area and the non-display area; disposing an exposure mask above the photosensitive composition and irradiating light to the photosensitive composition; and developing and curing the exposed photosensitive composition.

The exposure mask may include a light transmissive pattern, a semi-light-transmissive pattern, and a light shielding pattern.

The photosensitive composition is a positive-type photoresist, and the semi-light-transmissive pattern may be disposed above a second protective layer forming area.

The method may further include forming a color filter on the first substrate before the forming the protective layer.

The forming of the color filter and the forming of the step-difference pattern may be performed in substantially a same process.

The forming of the step-difference pattern may include forming the step-difference pattern to have a thickness greater than a thickness of the second protective layer.

The method may further include: after the forming the protective layer, forming a transparent electrode on the second protective layer, the transparent electrode connected to the gate pad through the protective-layer contact hole; and disposing a conductive ball above the transparent electrode, the conductive ball connecting the transparent electrode and a common electrode.

The method may further include: after the forming the transparent electrode, forming a light shielding portion and a column spacer protruding from the light shielding portion on the protective layer and the transparent electrode.

The method may further include defining a light-shielding-portion hole in the light shielding portion, the light-shielding-portion hole having a diameter larger than a diameter of the conductive ball.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Figure 1:
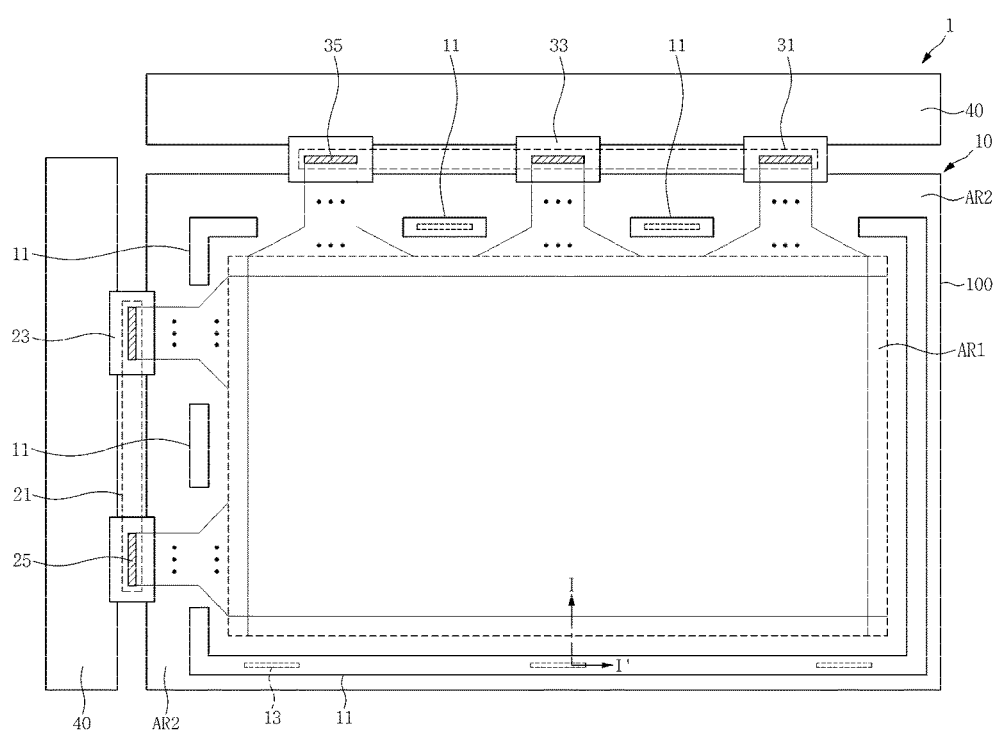
FIG. 1 is a plan view illustrating a display device according to an exemplary embodiment.

Features of the inventive concept and methods for achieving them will be made clear from exemplary embodiments described below in detail with reference to the accompanying drawings. The inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to those skilled in the art. The inventive concept is merely defined by the scope of the claims. Therefore, well-known constituent elements, operations and techniques are not described in detail in the exemplary embodiments in order to prevent the inventive concept from being obscurely interpreted. Like reference numerals refer to like elements throughout the specification.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments, and like reference numerals refer to like elements throughout the specification.

A display device 1 according to exemplary embodiments is described on the premise that it is a liquid crystal display ("LCD") device, but the embodiments are not limited thereto. Embodiments may also be applied to an organic electroluminescence display device.

Figure 2:
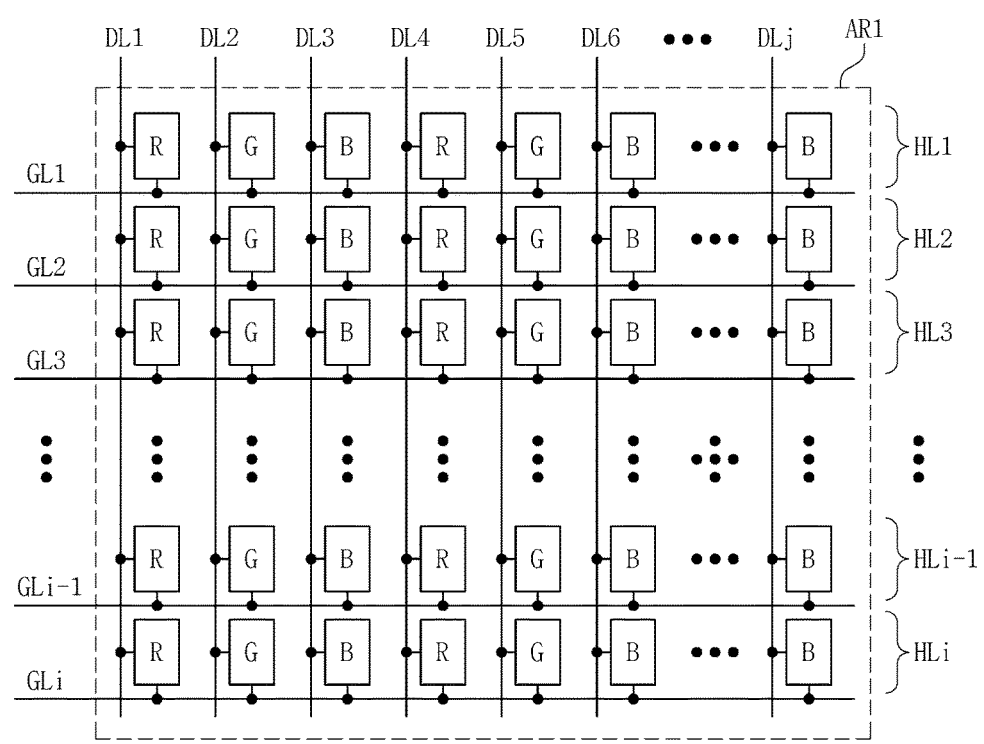
FIG. 2 is a schematic diagram illustrating pixels included in a display panel.
Figure 3:
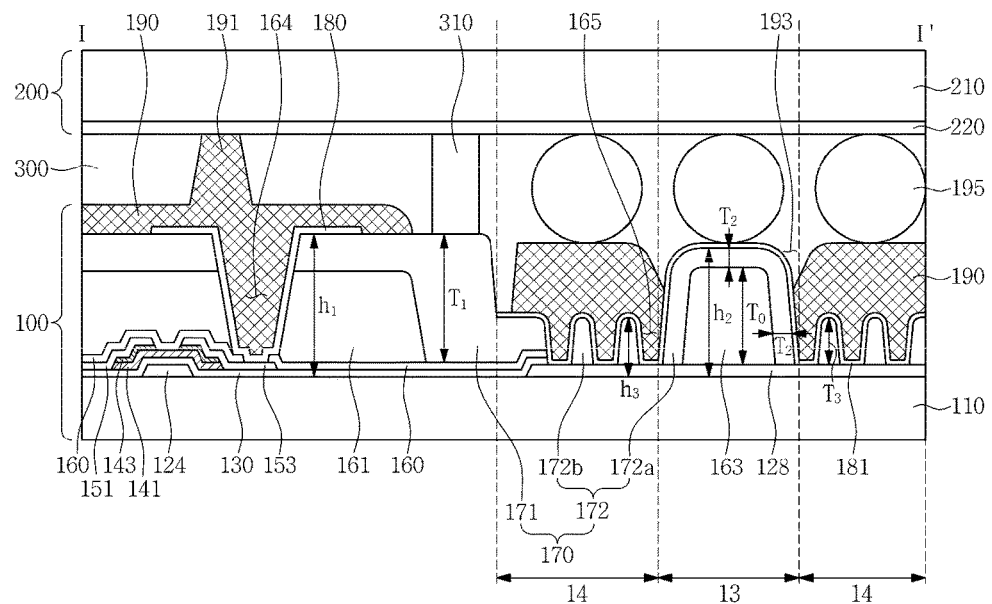
FIG. 3 is a cross-sectional view taken along line I-I' of FIG. 1.

FIG. 1 is a plan view illustrating a display device 1 according to an exemplary embodiment, FIG. 2 is a schematic diagram illustrating pixels included in a display panel 10, and FIG. 3 is a cross-sectional view taken along line I-I' of FIG. 1.

Referring to FIGS. 1, 2, and 3, the display device 1 includes the display panel 10, a gate driver 21, a data driver 31, and a circuit board 40.

A display area AR1 of the display panel 10 corresponds to a display area AR1 of a first panel 100 and a display area AR1 of a second panel 200. A non-display area AR2 of the display panel 10 corresponds to a non-display area AR2 of the first panel 100 and a non-display area AR2 of the second panel 200.

The first panel 100 has a larger area than an area of the second panel 200. The first panel 100 and the second panel 200 face each other, having a liquid crystal layer 300 interposed therebetween.

As illustrated in FIG. 1, the first panel 100 includes a first substrate 110, a plurality of gate lines GL1 to GLi, a plurality of data lines DL1 to DLj, and a common line 11. The gate lines GL1 to GLi, the data lines DL1 to DLj, and the common line 11 are disposed on the first substrate 110.

The data lines DL1 to DLj intersect the gate lines GL1 to GLi. The gate lines GL1 to GLi extend to the non-display area AR2 to be connected to the gate driver 21 and the data lines DL1 to DLj extend to the non-display area AR2 to be connected to the data driver 31.

The gate driver 21 includes a plurality of gate driving integrated circuits ("ICs") 25. The gate driving ICs 25 generate gate signals and sequentially apply the gate signals to the first to i-th gate lines GL1 to GLi.

Each of the gate driving ICs 25 is mounted on a gate carrier 23. The gate carriers 23 are electrically connected to the first panel 100. For example, each of the gate carriers 23 may be electrically connected between the circuit board 40 and a non-display area AR2 of the first substrate 110.

The data driver 31 includes a plurality of data driving ICs 35. The data driving ICs 35 receive digital image data signals and a data control signal from a timing controller. The data driving ICs 35 sample the digital image data signals according to the data control signal, latch the sampled image data signals corresponding to one horizontal line in each horizontal period, and apply the latched image data signals to the data lines DL1 to DLj. That is, the data driving ICs 35 convert the digital image data signals applied from the timing controller into analog image signals using a gamma voltage applied from a power supply (not illustrated) and apply the analog image signals to the data lines DL1 to DLj.

Each of the data driving ICs 35 is mounted on a data carrier 33. The data carriers 33 are connected between the circuit board 40 and the first panel 100. For example, each of the data carriers 33 may be electrically connected between the circuit board 40 and the non-display area AR2 of the first substrate 110.

The aforementioned timing controller and the power supply may be disposed on the circuit board 40. The data carrier 33 may include input wirings for transmitting various signals applied from the timing controller and the power supply to the data driving IC 35 and output wirings for transmitting the image data signals output from the data driving IC 35 to respective corresponding ones of the data lines DL1 to DLj. In an exemplary embodiment, at least one carrier may further include auxiliary wirings for transmitting various signals applied from the timing controller and the power supply to the gate driver 21, and the auxiliary wirings are connected to panel wirings on the first panel 100. The panel wirings connect the auxiliary wirings and the gate driver 21. The panel wirings may be formed in the non-display area AR2 of the first substrate 110 in a line-on-glass manner.

The common line 11 is disposed in the non-display area AR2 of the first substrate 110. In such an exemplary embodiment, as illustrated in FIG. 1, the common line 11 does not overlap the gate lines GL1 to GLi and the data lines DL1 to DLj. The common line 11 may be a gate pad 128 to be described below. In addition, a gate pad 128 may be disposed on the common line 11.

The common line 11 receives a common voltage from the aforementioned power supply. To this end, the common line 11 may be connected to the power supply via a wiring disposed in the gate carrier 23 or the data carrier 33.

The second panel 200 includes a second substrate 210 and a common electrode 220 on the second substrate 210.

The common electrode 220 of the second panel 200 is connected to the common line 11 of the first panel 100 through a short portion 13. The common electrode 220 receives the common voltage from the common line 11 through the short portion 13.

As illustrated in FIG. 2, the display panel 10 includes a plurality of pixels R, G, and B. The pixels R, G and B, as illustrated in FIG. 2, are disposed in the display area AR1 of the display panel 10.

The pixels R, G, and B are arranged in a matrix form. The pixels R, G and B are classified into a red pixel R displaying a red image, a green pixel G displaying a green image, and a blue pixel B displaying a blue image. In such an exemplary embodiment, a red pixel R, a green pixel G, and a blue pixel B adjacent to one another in a horizontal direction may define a unit pixel for displaying a unit image.

There are "j" number of pixels PX arranged along an n-th (n is one selected from 1 to i) horizontal line (hereinafter, n-th horizontal line pixels), which are connected to the first to j-th data lines DL1 to DLj, respectively. Further, the n-th horizontal line pixels are connected to the n-th gate line in common. Accordingly, the n-th horizontal line pixels receive an n-th gate signal as a common signal. That is, "j" number of pixels disposed on a same horizontal line receive a same gate signal, while pixels disposed on different horizontal lines receive different gate signals, respectively. For example, both of a red pixel R and a green pixel G disposed on the first horizontal line HL1 receive a first gate signal, while both of a red pixel R and a green pixel G disposed on the second horizontal line HL2 receive a second gate signal having a different timing from a timing of the first gate signal.

Hereinafter, configurations of the first panel 100 will be described in detail.

Referring to FIG. 3, the first panel 100 includes the first substrate 110, a gate wiring 124, GL, and 128, a gate insulating layer 130, a semiconductor layer 141, a data wiring DL, 151, and 153, an insulating interlayer 160, a color filter 161, a step-difference pattern 163, a protective layer 170, a pixel electrode 180, and a light shielding portion 190.

The first substrate 110 may be an insulating substrate, e.g., a plastic substrate, having light transmittance and flexibility. However, exemplary embodiments are not limited thereto, and the first substrate 110 may include a hard substrate such as a glass substrate. That is, the first substrate 110 may include a transparent material such as plastic or glass e.g., soda lime glass or borosilicate glass.

The gate wiring 124, GL, and 128 is disposed on the first substrate 110 and transmits a gate signal. The gate wiring 124, GL, and 128 includes a gate line GL, a gate electrode 124, and the gate pad 128.

Referring to FIG. 2, the gate line GL, e.g., one or more of the gate lines GL1 to GLi, extends in a first direction on a substrate. For example, the gate line GL extends in a transverse direction in the drawings. The gate line GL sequentially outputs a gate signal in response to a gate control signal externally applied thereto. The gate signal includes a gate-on voltage Von that may turn on thin film transistors ("TFTs") connected to a selected gate line GL and a gate-off voltage Voff that may turn off TFTs connected to unselected gate lines. A contact portion (e.g., an end portion) of the gate line GL may have a larger area than an area of another portion thereof, so as to be connected to another layer or an external driving circuit.

The gate electrode 124 protrudes from the gate line GL to form a protrusion. The gate electrode 124, along with a source electrode 151 and a drain electrode 153 to be described below, define three terminals of a TFT.

The gate pad 128 is disposed in the non-display area AR2 of the first substrate 110 and may be electrically connected to another layer or an external driving circuit. For example, the gate pad 128 may be the common line 11 and may receive a common voltage from the aforementioned power supply.

The gate wiring 124, GL, and 128 may include or be formed of: aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti).

In addition, the gate wiring 124, GL, and 128 may have a multilayer structure including at least two conductive layers (not illustrated) having different physical properties.

For example, one conductive layer of the multilayer structure may include a metal having low resistivity to reduce signal delay or voltage drop, e.g., an aluminum (Al)-based metal, a silver (Ag)-based metal, and a copper (Cu)-based metal.

On the other hand, another conductive layer of the multilayer structure may include a material that is found to impart an excellent contact property with indium tin oxide (ITO) and indium zinc oxide (IZO), e.g., a molybdenum-based metal, chromium, titanium, tantalum, and the like.

Examples of the multilayer structure may include a chromium lower layer and an aluminum upper layer, an aluminum lower layer and a molybdenum upper layer, and a titanium lower layer and a copper upper layer. However, exemplary embodiments are not limited thereto, and the gate wiring 124, GL, and 128 may include various kinds of metals and conductors.

The gate insulating layer 130 is disposed on the gate line GL, the gate electrode 124, and the gate pad 128. In such an exemplary embodiment, the gate insulating layer 130 may be disposed on an entire surface of the first substrate 110 including the gate line GL, the gate electrode 124, and the common line 11.

The gate insulating layer 130 may include or be formed of silicon nitride (SiNx), silicon oxide (SiOx), or the like. The gate insulating layer 130 may have a multilayer structure including at least two insulating layers having different physical properties.

The semiconductor layer 141 is disposed on the gate insulating layer 130 and forms a channel of the TFT. In such an exemplary embodiment, the semiconductor layer 141 is disposed to overlap at least the gate electrode 124. The semiconductor layer 141 may include an amorphous silicon (hereinafter, a-Si) or an oxide semiconductor including at least one element of gallium (Ga), indium (In), tin (Sn), and zinc (Zn).

An ohmic contact layer 143 is disposed on the semiconductor layer 141. The ohmic contact layer 143 serves to improve the contact properties between the semiconductor layer 141 and the source electrode 151 and/or between the semiconductor layer 141 and the drain electrode 153.

Herein, the ohmic contact layer 143 may include an amorphous silicon (hereinafter, n+ a-Si) doped with an n-type impurity at high concentration. In an exemplary embodiment, in a case where the contact properties between the semiconductor layer 141 and the source electrode 151 and/or between the semiconductor layer 141 and the drain electrode 153 are sufficiently ensured, the ohmic contact layer 143 of the present exemplary embodiment may be omitted.

The data wiring DL, 151, and 153 is disposed on the gate insulating layer 130 and the semiconductor layer 141, and includes the data line DL, the source electrode 151, and the drain electrode 153.

The data line DL, e.g., one or more of the data lines DL1 to DLj, is disposed on the gate insulating layer 130 and extends in a second direction. For example, the data line DL is disposed to intersect the gate line GL formed in the transverse direction, and defines a pixel unit, along with the gate line GL. Although not illustrated, a contact portion (e.g., an end portion) of the data line DL may have a larger area than an area of another portion thereof, so as to be connected to another layer or an external driving circuit. Although not illustrated, a portion of the data line DL intersecting the gate line GL may have a smaller line width than a line width of another portion of the data line DL. Accordingly, a parasitic capacitance between the data line DL and the gate line GL may be reduced. The data line DL may include or be formed of a refractory metal, such as molybdenum, chromium, tantalum, and titanium, and/or an alloy thereof, and may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, the data line DL may include or be formed of any suitable metals and/or conductors rather than the aforementioned materials.

The source electrode 151 is disposed on a portion of the ohmic contact layer 143 that is in contact with a portion of the semiconductor layer 141. The source electrode 151 extends from the data line DL. For example, the source electrode 151 has a shape protruding from the data line DL toward the gate electrode 124. The source electrode 151 overlaps the semiconductor layer 141 and the gate electrode 124. The source electrode 151 may include substantially a same material and may have substantially a same structure (e.g., a multilayer structure) as those of the data line DL. That is, the source electrode 151 and the data line DL may be simultaneously formed in substantially a same process.

The drain electrode 153 is disposed on another portion of the ohmic contact layer 143 that is in contact with another portion of the semiconductor layer 141. The drain electrode 153 overlaps the gate electrode 124 and the semiconductor layer 141. The drain electrode 153 is connected to the pixel electrode 180 to be described below. The drain electrode 153 may include substantially a same material and may have substantially a same structure (e.g., a multilayer structure) as those of the source electrode 151. That is, the drain electrode 153 and the source electrode 151 may be simultaneously formed in substantially a same process.

The gate electrode 124, the source electrode 151, and the drain electrode 153, along with the semiconductor layer 141 and the ohmic contact layer 143, define a TFT. In such an exemplary embodiment, a channel of the TFT is positioned in a portion of the semiconductor layer 141 between the source electrode 151 and the drain electrode 153. The portion of the semiconductor layer 141 corresponding to the channel may have a thickness less than that of another portion thereof.

The insulating interlayer 160 is disposed on the data line DL, the source electrode 151, the drain electrode 153, and the gate insulating layer 130.

In such an exemplary embodiment, the insulating interlayer 160 may be disposed over an entire surface of the first substrate 110 including the data line DL, the source electrode 151, the drain electrode 153, and the gate insulating layer 130. The insulating interlayer 160 may include an inorganic insulating material such as silicon nitride ($SiN_x$) or silicon oxide ($SiO_x$), and in such an exemplary embodiment, an inorganic insulating material having photosensitivity and having a dielectric constant of about 4.0 may be used. In an alternative exemplary embodiment, the insulating interlayer 160 may have a double-layer structure including a lower inorganic layer and an upper organic layer, which is found to impart excellent insulating properties and not to damage an exposed portion of the semiconductor layer 141.

The insulating interlayer 160 may have a thickness greater than or equal to about 5000 Å, e.g., in a range of about 6000 Å to about 8000 Å.

The color filter 161 is disposed on the insulating interlayer 160. An edge portion of the color filter 161 is disposed on the gate line GL, the TFT, and the data line DL. The edge portion of one of the color filters 161 may overlap an edge portion of another of the color filters 161 adjacent thereto. The color filter 161 may include a photosensitive organic material.

The step-difference pattern 163 is disposed on the insulating interlayer 160. For example, the step-difference pattern 163 is disposed in the short portion 13 of the non-display area AR2. In an exemplary embodiment, the step-difference pattern 163 extends in a direction parallel to the gate line GL. The step-difference pattern 163 may include a photosensitive organic material, and may include substantially a same material and may have substantially a same structure as those of the color filter 161. That is, the step-difference pattern 163 and the color filter 161 may be simultaneously formed in substantially a same process.

In addition, referring to FIG. 3, the step-difference pattern 163 has a greater thickness than a thickness of a second protective layer 172 (T0>T2, T0>T3). In such an exemplary embodiment, a transparent electrode 181 to be described below is formed relatively adjacent to the common electrode 220, and thus electric connection through conductive balls 195 may be relatively easily established.

Referring to FIG. 3, the protective layer 170 is disposed on the color filter 161, the insulating interlayer 160, and the step-difference pattern 163, and includes a first protective layer 171 and a second protective layer 172. The protective layer 170 may be disposed over an entire surface of the first substrate 110 including the color filter 161 and the insulating interlayer 160. The protective layer 170 may include an organic material. The protective layer 170 may include an inorganic insulating material such as silicon nitride ($SiN_x$) or silicon oxide ($SiO_x$), and in such an exemplary embodiment, an inorganic insulating material having photosensitivity and having a dielectric constant of about 4.0 may be used. In an alternative exemplary embodiment, the protective layer 170 may have a double-layer structure including a lower inorganic layer and an upper organic layer, which is found to impart excellent insulating properties and not to damage an exposed portion of the semiconductor layer 141.

The first protective layer 171 is disposed in the display area AR1. In more detail, the first protective layer 171 is disposed on the insulating interlayer 160 in the display area AR1 and on the color filter 161, and has a protective-layer contact hole 164 extending to and exposing the drain electrode 153. The first protective layer 171 may have a thickness T1 ranging from about 1.0 µm to about 2.5 µm.

The second protective layer 172 is disposed in the non-display area AR2. In more detail, the second protective layer 172 is disposed on the gate pad 128 in the non-display area AR2 and on the step-difference pattern 163, and has a protective-layer contact hole 165 extending to and exposing the gate pad 128. In such an exemplary embodiment, the second protective layer 172, which includes second protective layers 172a, 172b, has a height less than a height of the first protective layer 171 with respect to the first substrate 110. That is, a height h2 of the second protective layer 172a on the step-difference pattern 163 is less than a height h1 of the first protective layer 171 (h1>h2), and a height h3 of the second protective layer 172b on the gate pad 128 in the non-display area AR2 is less than the height h1 of the first protective layer 171 (h1>h3) as well. For example, the second protective layer 172b on the gate pad 128 in the non-display area AR2 may have the height h3 about half the height h1 of the first protective layer 171 or less. Accordingly, a height increase of the non-display area AR2 due to disposition of the light shielding portion 190 to be described below may be reduced.

In addition, the height h2 of the second protective layer 172a on the step-difference pattern 163 is greater than the height h3 of the second protective layer 172b on the gate pad 128 in the non-display area AR2 (h2>h3). Accordingly, a step difference between the short portion 13 in which the step-difference pattern 163 is disposed and a peripheral portion 14 in which the light shielding portion 190 is disposed is reduced. When the step difference decreases, effects of a height variable according to the position of the conductive ball 195 are reduced, and the conductive ball 195 in the short portion 13 may connect the common electrode 220 and the transparent electrode 181 irrespective of the position of the conductive ball 195 in the peripheral portion 14. Accordingly, contact failure between the first substrate 110 and the second substrate 210 in the non-display area AR2 may be reduced.

The pixel electrode 180 is disposed on the first protective layer 171, and passes through the first protective layer 171, the color filter 161, and the insulating interlayer 160 to be connected to the drain electrode 153. The pixel electrode 180 may include a transparent conductive material such as indium tin oxide (ITO) or indium zinc oxide (IZO). In such an exemplary embodiment, ITO may be a polycrystalline material or a monocrystalline material, and IZO may be a polycrystalline material or a monocrystalline material as well.

The transparent electrode 181 is disposed on the gate pad 128 and the second protective layer 172. The transparent electrode 181 passes through the second protective layer 172 to be connected to the gate pad 128. The transparent electrode 181 may include a transparent conductive material such as ITO or IZO. In such an exemplary embodiment, ITO may be a polycrystalline material or a monocrystalline material, and IZO may be a polycrystalline material or a monocrystalline material as well. That is, the transparent electrode 181 may include substantially a same material and may have substantially a same structure as those of the pixel electrode 180. That is, the transparent electrode 181 and the pixel electrode 180 may be simultaneously formed in substantially a same process.

The light shield portion 190 is disposed on the pixel electrode 180, the transparent electrode 181, and the protective layer 170 to prevent light from being emitted through an area other than a pixel area. That is, the light shielding portion 190 prevents light leakage. To this end, the light shielding portion 190 has an opening corresponding to the pixel area, and covers an entire area except the pixel area. The pixel area is defined by the light shielding portion 190. The light shielding portion 190 may have a dielectric constant ranging from about 3 to about 5.

For example, the light shielding portion 190 may include a horizontal portion and a vertical portion.

The horizontal portion extends along the gate line GL and the short portion 13. The horizontal portion overlaps the gate line GL, the TFT, and the data line DL. In such an exemplary embodiment, all of the gate electrode 124, the source electrode 151 and the drain electrode 153 of the TFT overlap the horizontal portion.

The vertical portion is disposed among adjacent ones of the horizontal portions and extends along the data line DL. The vertical portion overlaps the data line DL. The vertical portion of the light shielding portion 190 may contact the pixel electrode 180. For example, the vertical portion may contact an upper surface of the pixel electrode 180.

However, the disposition of the light shielding portion 190 is not limited thereto, and the light shield 190 may be disposed only above the gate line GL.

In such an exemplary embodiment, the light shielding portion 190 has a light-shielding-portion hole 193 in the short portion 13 of the non-display area AR2. The light-shielding-portion hole 193 overlaps the step-difference pattern 163 and has a larger diameter than that of the conductive ball 195. In such an exemplary embodiment, the conductive ball 195 may easily contact the transparent electrode 181 in the light-shielding-portion hole 193. In addition, a step difference between the short portion 13 and the peripheral portion 14 is reduced so that the transparent electrode 181 and the common electrode 220 may be easily connected through the conductive ball 195 in the short portion 13.

The light shielding portion 190 may include a negative-type photosensitive composition of which an unexposed portion is developed. The photosensitive composition forming the light shielding portion 190 may include, for example, a binder resin, a polymerizable monomer, a polymerizable oligomer, a pigment, a dispersant, and a photo initiator. The pigment may use a black pigment or a black resin. Hereinafter, the photosensitive composition forming the light shielding portion 190 is referred to as "a light blocking material."

A column spacer 191 is disposed on the light shielding portion 190. The column spacer 191 has a structure protruding from a surface of the light shielding portion 190. The column spacer 191 substantially supports the first substrate 110 and the second substrate 210 to secure a spacing space. The display device 1 according to an exemplary embodiment may further include a sub-column spacer (not illustrated). Upon being externally applied with pressure, the sub-column spacer disperses the pressure applied to the column spacer 191 to serve a buffering function.

In addition, the column spacer 191 may be integrally formed with the light shielding portion 190 through a photolithography method, using substantially a same material. In a case where the light shielding portion 190, the column spacer 191, and the sub-column spacer are integrally formed using a negative-type photosensitive composition, it is necessary that the column spacer 191 and the sub-column spacer are precisely patterned to have different heights.

The conductive ball 195 is disposed between the common electrode 220 and the transparent electrode 181 and connects the common electrode 220 and the transparent electrode 181. That is, the conductive ball 195 receives a voltage from the transparent electrode 181, and applies the voltage to the common electrode 220. The conductive ball 195 may include a metal such as gold.

In addition, the conductive ball 195 may be disposed above the light shielding portion 190 in the non-display area AR2 to maintain a uniform distance from the second panel 200.

The second panel 200 may include the second substrate 210, the common electrode 220, and the like.

The second substrate 210 may be an insulating substrate, e.g., a plastic substrate, having light transmittance and flexibility. However, exemplary embodiments are not limited thereto, and the second substrate 210 may include a hard substrate such as a glass substrate.

The common electrode 220 may be a whole planar electrode including a transparent conductive element such as ITO or IZO. In an alternative exemplary embodiment, the common electrode 220 may have an uneven portion and at least one slit for defining a plurality of domains.

An upper alignment layer (not illustrated) may be disposed on the common electrode 220. The upper alignment layer may be a vertical alignment layer or a photo alignment layer including a photopolymerizable material.

The liquid crystal layer 300 is disposed between the first panel 100 and the second panel 200.

The liquid crystal layer 300 may include a nematic liquid crystal material having a positive dielectric anisotropy. The liquid crystal molecules of the liquid crystal layer 300 may have a structure in which a major axis thereof is aligned parallel to one of the first panel 100 and the second panel 200, and the direction is spirally twisted about 90 degrees from a rubbing direction of the alignment layer of the first panel 100 to the second panel 200.

A sealing portion 310 is disposed between the first substrate 110 and the second substrate 210. In more detail, the sealing portion 310 is disposed between the non-display area AR2 of the first panel 100 and the non-display area AR2 of the second panel 200. The sealing portion 310 may have a closed-loop shape surrounding the display area AR1, for example.

FIGS. 4A, 4B, 4C, 4D, and 4E are diagrams illustrating a process of a method of manufacturing the display device 1 according to an exemplary embodiment. Hereinafter, the method of manufacturing the display device 1 according to an exemplary embodiment will be described with reference to FIGS. 4A, 4B, 4C, 4D, and 4E.

Figure 4A:
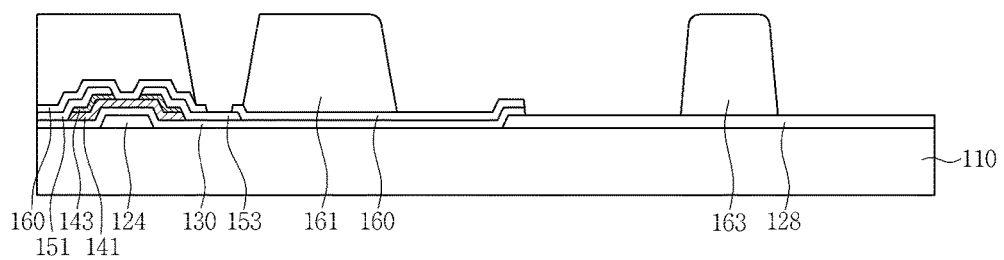
FIGS. 4A, 4B, 4C, 4D, and 4E are diagrams illustrating a process of a method of manufacturing a display device according to an exemplary embodiment.
Figure 4B:
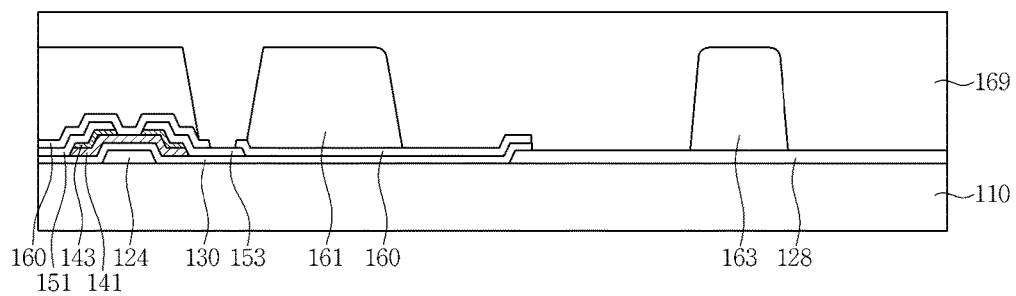

Referring to FIG. 4A, a gate wiring 124, GL, and 128, a gate insulating layer 130, a semiconductor layer 141, a data line wiring DL, 151, and 153, an insulating interlayer 160, a color filter 161, and a step-difference pattern 163 are formed on a first substrate 110 including a transparent material such as glass or plastic.

In more detail, the gate wiring 124, GL, and 128 is formed on the first substrate 110 in a display area AR1. The gate wiring 124, GL, and 128 includes a gate line GL extending in a first direction, e.g., a transverse direction, a gate electrode 124 protruding from the gate line GL, and a gate pad 128 in a non-display area AR2. In such an exemplary embodiment, the gate line GL, the gate electrode 124, and the gate pad 128 may be integrally formed through a photolithography method, using substantially a same material.

The gate insulating layer 130, including silicon nitride (SiNx) or silicon oxide (SiOx), is formed on the gate wiring 124, GL, and 128, and the semiconductor layer 141 is formed on the gate insulating layer 130.

An ohmic contact layer 143 may be disposed on the semiconductor layer 141 so as to improve contact properties between the semiconductor layer 141 and a source electrode 151 and/or between the semiconductor layer 141 and a drain electrode 153. In a case where the contact properties between the semiconductor layer 141 and the source electrode 151 and/or between the semiconductor layer 141 and the drain electrode 153 are sufficiently ensured, the ohmic contact layer 143 may be omitted.

A data line DL, the source electrode 151, and the drain electrode 153 are formed on the semiconductor layer 141 and the gate insulating layer 130. The data line DL intersects the gate line GL, and may extend in, e.g., a longitudinal direction. The source electrode 151 is branched off from the data line DL to extend onto the semiconductor layer 141. The drain electrode 153 is formed above the semiconductor layer 141, spaced apart from the source electrode 151.

The insulating interlayer 160 is formed on the data line DL, the source electrode 151, the drain electrode 153, and the gate insulating layer 130.

Subsequently, the plurality of color filters 161 including a red color filter, a green color filter, and a blue color filter are formed on the insulating interlayer 160 in the display area AR1. The color filter 161 may be disposed in an island shape corresponding to each pixel area. The plurality of color filters 161 may be disposed to be spaced apart from one another in the transverse direction or the longitudinal direction, or may be arranged so that edge portions of adjacent ones of the color filters 161 may overlap one another.

In addition, the step-difference pattern 163 extending in one direction is formed on the gate pad 128 in the non-display area AR2. For example, the step-difference pattern 163 may be formed in the transverse direction and may include substantially a same material as that included in the color filter 161. In such an exemplary embodiment, the color filter 161 and the step-difference pattern 163 may be integrally formed through a photolithography method, using substantially a same material. In addition, the step-difference pattern 163 may be formed to have a greater thickness than that of a second protective layer 172.

Referring to 4B, a photosensitive composition 169 for forming a protective layer 170 is coated on the first substrate 110 on which the insulating interlayer 160, the color filter 161, and the step-difference pattern 163 are disposed. An upper portion of the color filter 161 is flattened by the application of the photosensitive composition 169.

In an exemplary embodiment, the photosensitive composition 169 is a positive-type photosensitive resin composition of which an exposed portion is developed and a non-exposed portion remains. However, exemplary embodiments are not limited thereto, and the photosensitive composition 169 may be a negative-type photosensitive resin composition of which the solubility to a developing solution is decreased by light irradiation.

The photosensitive composition 169 may include, for example, a binder resin, a polymerizable monomer, a polymerizable oligomer, a dispersant, and a photo initiator.

Figure 4C:
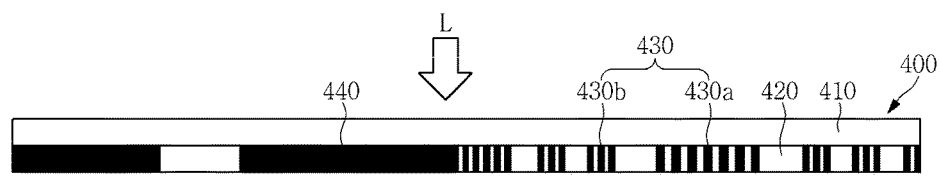
Figure 4C:
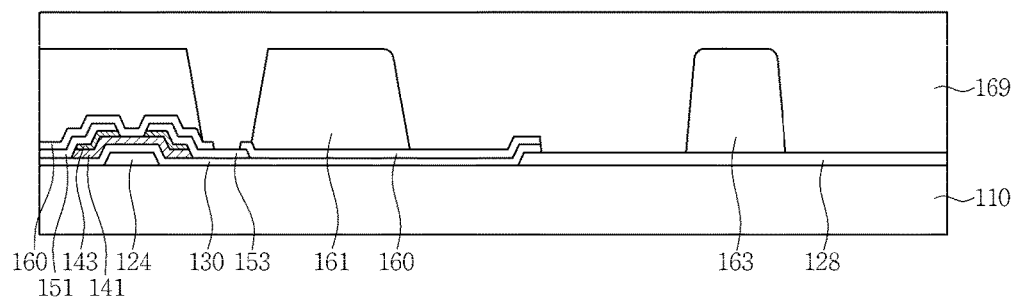

Referring to FIG. 4C, an exposure mask 400 is disposed above the photosensitive composition 169, spaced apart from the photosensitive composition 169, and light is irradiated to the photosensitive composition 169 through the exposure mask 400 to perform light exposure.

The exposure mask 400 includes a light transmissive pattern 420, a semi-light-transmissive pattern 430, and a light shielding pattern 440 on a transparent base 410.

The light transmissive pattern 420 of the exposure mask 400 corresponds to an area to be defined with protective-layer contact holes 164 and 165, the semi-light-transmissive pattern 430 corresponds to an area to be formed with the second protective layer 172, and the light shielding pattern 440 corresponds to an area to be formed with a first protective layer 171. In such an exemplary embodiment, the first protective layer 171 and the second protective layer 172 having different heights may be formed.

Respective light transmittances of the light transmissive pattern 420, the light shielding pattern 440, and the semi-light-transmissive pattern 430 of the mask may vary depending on the kinds of the photosensitive composition 169.

For example, based on the kinds of the photosensitive composition 169, the light transmissive pattern 420 may have a light transmittance ranging from about 90% to about 100%, the light shielding pattern 440 may have a light transmittance ranging from about 0% to about 1%, and the semi-light-transmissive pattern 430 may have a light transmittance ranging from about 30% to about 40%. In addition, the semi-light-transmissive pattern 430 may have a light transmittance ranging from about 60% to about 70%.

In such an exemplary embodiment, a semi-light-transmissive pattern 430a (hereinafter, "a first semi-light-transmissive pattern") corresponding to the second protective layer 172 in a short portion 13 and a semi-light-transmissive pattern 430b (hereinafter, "a second semi-light-transmissive pattern") corresponding to the second protective layer 172 in a peripheral portion 14 may have different light transmittances. That is, a four-tone mask including the first semi-light-transmissive pattern 430a and the second semi-light-transmissive pattern 430b, each having different light transmittances, may be used. For example, the first semi-light-transmissive pattern 430a may have a light transmittance ranging from about 30% to about 40%, and the second semi-light-transmissive pattern 430b may have a light transmittance ranging from about 60% to about 70%.

The semi-light-transmissive pattern 430 and the light shielding pattern 440 may be formed through selective application of a light shielding material. For example, the light transmittance of the semi-light-transmissive pattern 430 may be adjusted by adjusting the concentration of the light shielding material.

In addition, the semi-light-transmissive pattern 430 may have a slit structure in which a light transmitting area and a light shielding area are alternately arranged. In such an exemplary embodiment, the light transmittance of the semi-light-transmissive pattern 430 may be adjusted by adjusting the interval of the slits.

Figure 4D:
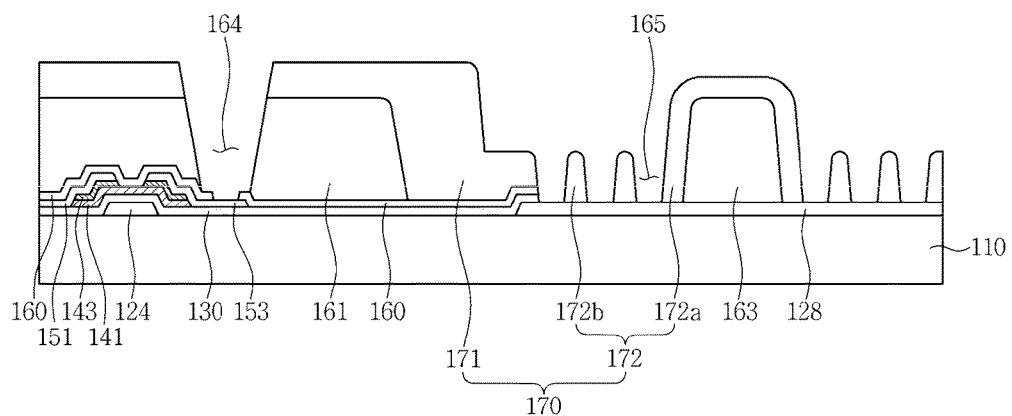

Referring to FIG. 4D, an exposed composition is developed, using a developing solution, and then cured to form the protective layer 170.

In more detail, the photosensitive composition 169 below the light transmissive pattern 420 of the exposure mask 400 is removed such that the protective-layer contact holes 164 and 165 are defined. In addition, the photosensitive composition 169 below the light shielding pattern 440 of the exposure mask 400 remains and a part of the photosensitive composition 169 below the semi-light-transmissive pattern 430 is removed, such that the first protective layer 171 and the second protective layer 172 having different heights are formed.

Figure 4E:
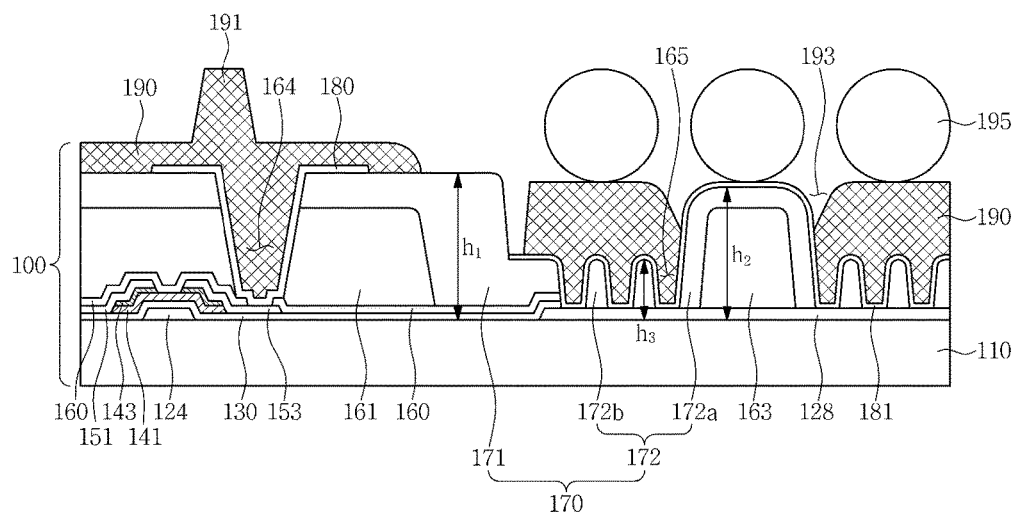

Referring to FIG. 4E, a pixel electrode 180 electrically connected to the drain electrode 153 and a transparent electrode 181 to be electrically connected to a common electrode 220 are formed on the protective layer 170.

Subsequently, a light shielding portion 190 is formed on the pixel electrode 180, and a column spacer 191 is formed on the light shielding portion 190. In such an exemplary embodiment, the column spacer 191 and the light shielding portion 190 may be integrally formed through a photolithography method, using substantially a same material. In such an exemplary embodiment, a light-shielding-portion hole 193 having a larger diameter than a diameter of a conductive ball 195 may be defined in the short portion 13 of the non-display area AR2.

Subsequently, the conductive ball 195 is formed above the light shielding portion 190 in the non-display area AR2 and above the transparent electrode 181. The conductive ball 195 receives a voltage from the transparent electrode 181 and applies the voltage to the common electrode 220. The conductive ball 195 may include a metal such as gold.

Subsequently, a second panel 200 (see FIG. 3) is disposed above the light shielding portion 190 and the conductive ball 195 so as to oppose a first panel 100, and a liquid crystal layer 300 is disposed between the first panel 100 and the second panel 200.

In more detail, after the common electrode 220 is formed on the second substrate 210, the liquid crystal layer 300 is disposed on the first panel 100, and the first panel 100 and the second panel 200 are attached to each other such that the display device 1 illustrated in FIGS. 1, 2, and 3 may be provided.

As set forth hereinabove, in one or more exemplary embodiments, contact failure between the first substrate and the second substrate may be reduced by reducing the thickness of the first panel in the non-display area and reducing a step difference between the short portion and the peripheral portion From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the inventive concept.

What is claimed is:

1. A display device comprising:
   a first substrate having a display area and a non-display area;
   a gate line in the display area and a gate pad in the non-display area, the gate line extending in a first direction;
   a data line in the display area, the data line extending in a second direction intersecting the first direction;
   a thin film transistor at an intersection point among the gate line and the data line;
   a step-difference pattern on the gate pad; and
   a protective layer comprising a first protective layer on the thin film transistor and a second protective layer on the step-difference pattern and the gate pad,
   wherein the second protective layer has a height less than a height of the first protective layer; and the protective layer on the step-difference pattern has a height greater than a height of the second protective layer on the gate pad.

2. The display device as claimed in claim 1, wherein the step-difference pattern has a thickness greater than a thickness of the second protective layer.

3. The display device as claimed in claim 1, wherein the second protective layer has a protective-layer contact hole extending to the gate pad, and
   the display device further comprises a transparent electrode on the second protective layer, the transparent electrode connected to the gate pad through the protective-layer contact hole.

4. The display device as claimed in claim 3, further comprising:
   a second substrate opposing the first substrate; and
   a common electrode on the second substrate.

5. The display device as claimed in claim 4, further comprising:
   a conductive ball disposed between the common electrode and the transparent electrode to connect the common electrode and the transparent electrode.

6. The display device as claimed in claim 5, further comprising:
   a light shielding portion on the protective layer and the transparent electrode; and
   a column spacer protruding from the light shielding portion.

7. The display device as claimed in claim 6, wherein the light shielding portion has a light-shielding-portion hole in the non-display area, and
   the light-shielding-portion hole has a diameter larger than a diameter of the conductive ball.

8. The display device as claimed in claim 1, wherein the step-difference pattern comprises a color filter.

9. A method of manufacturing a display device, the method comprising:
   preparing a first substrate having a display area and a non-display area;
   forming a gate line in the display area and forming a gate pad in the non-display area;
   forming a data line in the display area, the data line intersecting the gate line;
   forming a thin film transistor connected to the gate line and the data line;
   forming a step-difference pattern on the gate pad; and
   forming a protective layer comprising forming a first protective layer on the thin film transistor and forming a second protective layer on the step-difference pattern and the gate pad, the second protective layer having a protective-layer contact hole extending to the gate pad,
   wherein the second protective layer has a height less than a height of the first protective layer; and the second protective layer on the step-difference pattern has a height greater than a height of the second protective layer on the gate pad.

10. The method as claimed in claim 9, wherein the forming of the first protective layer and the forming of the second protective layer are performed in substantially a same process.

11. The method as claimed in claim 10, wherein the forming of the first protective layer and the forming of the second protective layer comprise:
   coating a photosensitive composition in the display area and the non-display area;
   disposing an exposure mask above the photosensitive composition and irradiating light to the photosensitive composition; and
   developing and curing the exposed photosensitive composition.

12. The method as claimed in claim 11, wherein the exposure mask comprises a light transmissive pattern, a semi-light-transmissive pattern, and a light shielding pattern.

13. The method as claimed in claim 12, wherein the photosensitive composition is a positive-type photoresist, and the semi-light-transmissive pattern is disposed above a second protective layer forming area.

14. The method as claimed in claim 9, further comprising forming a color filter on the first substrate before the forming the protective layer.

15. The method as claimed in claim 14, wherein the forming of the color filter and the forming of the step-difference pattern are performed in substantially a same process.

16. The method as claimed in claim 15, wherein the forming of the step-difference pattern comprises forming the step-difference pattern to have a greater thickness than a thickness of the second protective layer.

17. The method as claimed in claim 9, further comprising: after forming the protective layer,
   forming a transparent electrode on the second protective layer, the transparent electrode connected to the gate pad through the protective-layer contact hole; and
   disposing a conductive ball above the transparent electrode, the conductive ball connecting the transparent electrode and a common electrode.

18. The method as claimed in claim 17, further comprising: after the forming the transparent electrode, forming a light shielding portion and a column spacer protruding from the light shielding portion on the protective layer and the transparent electrode.

19. The method as claimed in claim 18, further comprising defining a light-shielding-portion hole in the light shielding portion, the light-shielding-portion hole having a diameter larger than a diameter of the conductive ball.

* * * * *